United States Patent
O'Leary et al.

(10) Patent No.: US 12,288,954 B2
(45) Date of Patent: Apr. 29, 2025

(54) SECONDARY SIDE HEATSINK TECHNIQUES FOR OPTICAL AND ELECTRICAL MODULES

(71) Applicant: Ciena Corporation, Hanover, MD (US)

(72) Inventors: Mitchell O'Leary, Ottawa (CA); Victor Aldea, Ottawa (CA); Kamran Rahmani, Kanata (CA); Trevor Meunier, Kemptville (CA); Peter Ajersch, Ottawa (CA); Terence Graham, Manotick (CA); Marc Leclair, Gatineau (CA)

(73) Assignee: Ciena Corporation, Hanover, MD (US)

( * ) Notice: Subject to any disclaimer, the term of this patent is extended or adjusted under 35 U.S.C. 154(b) by 370 days.

(21) Appl. No.: 17/761,036

(22) PCT Filed: Sep. 9, 2020

(86) PCT No.: PCT/US2020/049852
§ 371 (c)(1),
(2) Date: Mar. 16, 2022

(87) PCT Pub. No.: WO2021/055194
PCT Pub. Date: Mar. 25, 2021

(65) Prior Publication Data
US 2022/0352651 A1 Nov. 3, 2022

Related U.S. Application Data

(63) Continuation of application No. 16/571,722, filed on Sep. 16, 2019, now Pat. No. 10,939,536.

(51) Int. Cl.
*H01R 4/48* (2006.01)
*H01L 23/40* (2006.01)
*H01R 4/30* (2006.01)

(52) U.S. Cl.
CPC .............. *H01R 4/48* (2013.01); *H01L 23/40* (2013.01); *H01R 4/30* (2013.01)

(58) Field of Classification Search
CPC ........ H05K 7/026; H05K 7/10; H05K 7/1427; H05K 7/2039; H05K 7/2049;
(Continued)

(56) References Cited

U.S. PATENT DOCUMENTS

| | | | |
|---|---|---|---|
| 4,731,693 A * | 3/1988 | Berg | .................... H05K 7/1061 257/713 |
| 6,831,844 B1 | 12/2004 | Lee et al. | |
| 9,295,178 B1 | 3/2016 | Aldea et al. | |
| 9,759,235 B2 | 9/2017 | Saturley et al. | |

(Continued)

FOREIGN PATENT DOCUMENTS

WO      2015012792 A1      1/2015

OTHER PUBLICATIONS

Dec. 2, 2020, International Search Report and Written Opinion for International Patent Application No. PCT/US2020/049852.

*Primary Examiner* — Amir A Jalali
(74) *Attorney, Agent, or Firm* — Baratta Law PLLC; Lawrence A. Baratta, Jr.

(57) ABSTRACT

A module for use in a hardware platform for networking, computing, and/or storage includes a printed circuit board assembly having a primary side and a secondary side, wherein the primary side includes more physical space, in a vertical direction extending out from the printed circuit board assembly, than the secondary side; electrical and/or optical components disposed on the primary side of the printed circuit board assembly; and a secondary side heatsink located on and extending from the secondary side, wherein the secondary side heatsink is disposed to one of i) an electrical and/or optical component disposed on the secondary side, and ii) an optical component disposed on the primary side, for thermal management.

20 Claims, 14 Drawing Sheets

SECTION A-A

(58) Field of Classification Search
CPC .......... H05K 7/20409; H05K 7/20418–20518; H05K 5/0069; H05K 5/003; H05K 5/0286; H05K 5/20154; H05K 1/02; H05K 1/0203; H05K 1/021; H05K 1/181; H05K 2201/066; H05K 2201/10121; H05K 2201/10265; H05K 2201/10409; H05K 2201/10416; H04B 10/25; H04B 10/036; H04B 10/40; H04B 10/50; G06F 1/1656; G06F 1/182; G06F 1/186; G06F 1/203; G02B 6/3814; G02B 6/3821; G02B 6/3825; G02B 6/3831; G02B 6/3869; G02B 6/4202; G02B 6/4246; G02B 6/4256–4269; G02B 6/4277–4278; G02B 6/428; G02B 6/4292; H01R 4/30; H01R 4/48; H01R 13/424; H01R 13/6335; H01R 13/6581; H01R 13/6594; H01R 13/665–6658; H01R 12/716; H01R 12/91; H01R 24/60; H01R 2201/04; F28F 3/06; F28F 9/001; F28F 2275/085; H01L 23/34–40

See application file for complete search history.

(56) References Cited

U.S. PATENT DOCUMENTS

| | | | |
|---|---|---|---|
| 10,070,553 B2 | 9/2018 | Lee et al. | |
| 2004/0173901 A1* | 9/2004 | Mallik | H05K 1/0204 |
| | | | 257/E23.101 |
| 2004/0174679 A1* | 9/2004 | Hung | H01L 23/4006 |
| | | | 257/E23.084 |
| 2005/0133252 A1 | 6/2005 | Ajersch et al. | |
| 2009/0116194 A1* | 5/2009 | Matsushiba | H01L 23/13 |
| | | | 361/709 |
| 2010/0309635 A1* | 12/2010 | Sasaki | H01L 23/3677 |
| | | | 257/E23.083 |
| 2011/0114294 A1* | 5/2011 | Degner | H05K 7/2039 |
| | | | 165/185 |
| 2014/0161408 A1* | 6/2014 | Aoki | G02B 6/4269 |
| | | | 385/134 |
| 2018/0007776 A1 | 1/2018 | Gareau et al. | |
| 2019/0013442 A1* | 1/2019 | Morita | H01L 23/055 |
| 2019/0274216 A1* | 9/2019 | Kubota | H05K 1/0201 |
| 2019/0364656 A1* | 11/2019 | Robin | H05K 1/181 |
| 2021/0112315 A1* | 4/2021 | Mays | G02B 6/4268 |

* cited by examiner

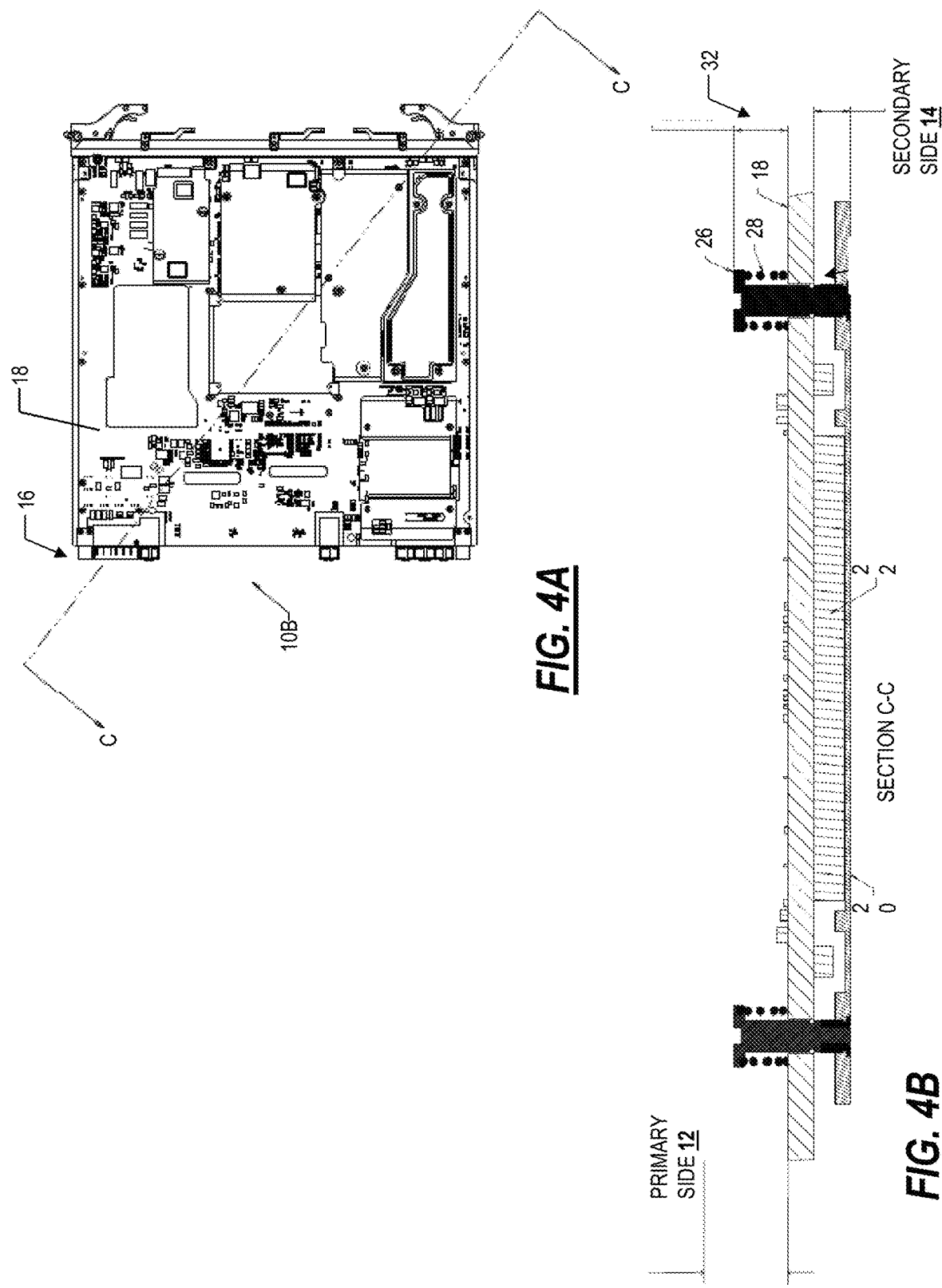

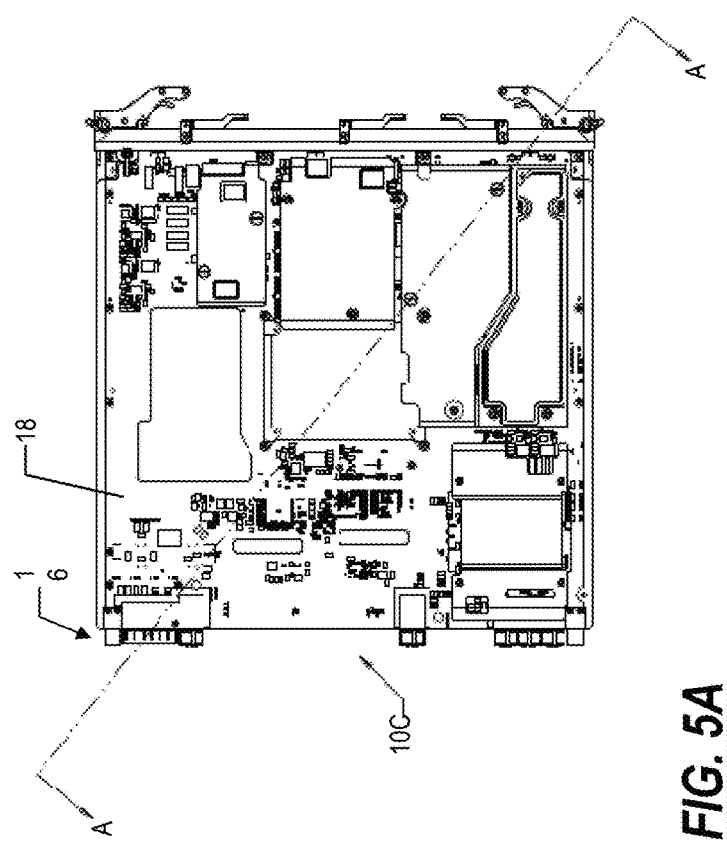
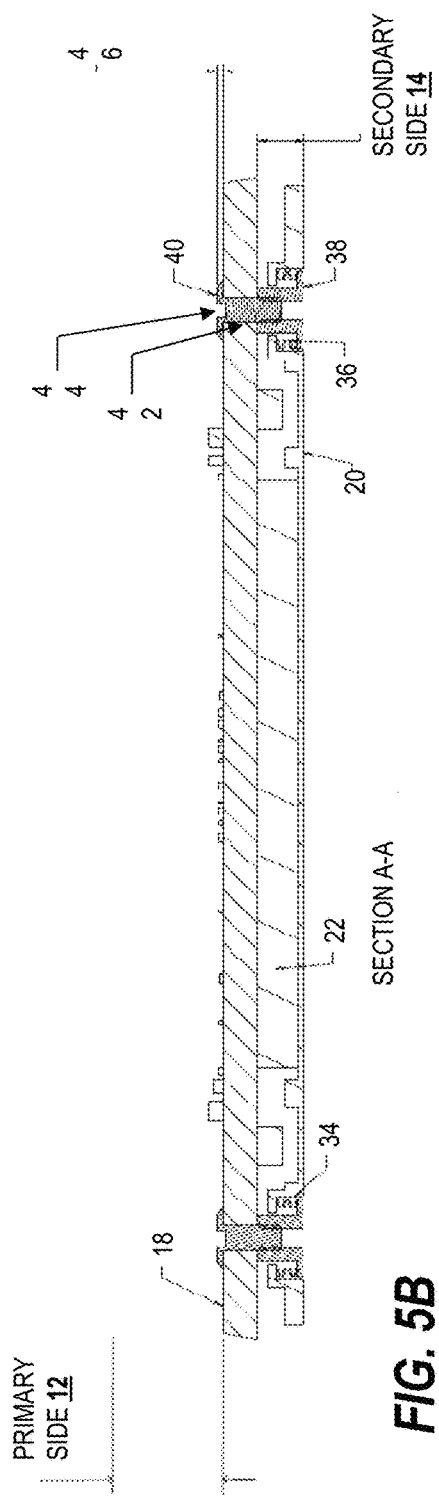
FIG. 5A
FIG. 5B

SECTION B-B

SECTION C-C

SECTION D-D

SECONDARY SIDE HEATSINK TECHNIQUES FOR OPTICAL AND ELECTRICAL MODULES

FIELD OF THE DISCLOSURE

The present disclosure generally relates to cooling via heatsinks of electrical and optical hardware. More particularly, the present disclosure relates to systems and methods for a secondary side heatsink for optical and electrical modules.

BACKGROUND OF THE DISCLOSURE

Thermal management, i.e., cooling to dissipate heat, is a challenge in networking hardware (as well as compute, storage, etc. hardware). The challenge is due to the ever-increasing capacity and density. As described herein, hardware includes electrical and/or optical components that are mounted on a Printed Circuit Board Assembly (PCBA). Networking, computing, and/or storage devices are formed via hardware modules which include the PCBA and which are typically engaged in a chassis, shelf, or the like, i.e., a hardware platform. A hardware module, or simply a module, may also be referred to as a circuit pack, a line module, a blade, etc. Modules are getting increasingly more powerful along with the PCBA design becoming significantly more complex and densely packed. As a result, thermal management requirements are increasing, and the component placement locations are limited. A PCBA can have a primary side where the bulk of optical and electrical components are mounted and a secondary side opposite the primary side. In this context, the secondary side is space-constrained relative to the primary side, specifically in a vertical direction. Further, as component placement is limited, there are techniques where components are being mounted on the secondary side.

There are various techniques for thermal management in a hardware platform, including heatsinks, heat spreaders, airflow (fans), etc. Heatsinks or heat spreaders require real estate which is at a premium on high density modules. The airflow is fixed based on a type of hardware platform. There is a need for thermal management improvements, including thermal management on the secondary side.

BRIEF SUMMARY OF THE DISCLOSURE

In an embodiment, a module for use in a hardware platform for networking, computing, and/or storage, includes a printed circuit board assembly having a primary side and a secondary side, wherein the primary side includes more physical space, in a vertical direction extending out from the printed circuit board assembly, than the secondary side; electrical and/or optical components disposed on the primary side of the printed circuit board assembly; and a secondary side heatsink located on and extending from the secondary side, wherein the secondary side heatsink is disposed to one of i) an electrical and/or optical component disposed on the secondary side, and ii) an optical component disposed on the primary side, for thermal management. The primary side can include interface components for connectivity to data and/or power connections in the hardware platform. The secondary side heatsink can be a floating heatsink disposed to the electrical and/or optical component disposed on the secondary side. The electrical and/or optical component disposed on the secondary side can be a Ball Grid Array (BGA) component. The floating heatsink can be connected through the printed circuit board assembly to the primary side via a compact wave spring.

The secondary side heatsink can be a coin-style heatsink that extends through the printed circuit board assembly to the optical component disposed on the primary side. The coin-style heatsink can have an adjustable height on the secondary side. The coin-style heatsink can have an adjustable height on the secondary side via set screws and cylindrical posts. The optical component disposed on the primary side can be a pluggable module. The module can further include a cage disposed on the primary side, for the optical component, wherein a hole is located in the printed circuit board assembly where the secondary side heatsink is able to contact the pluggable module. The secondary side heatsink can be a coin-style heatsink that protrudes from the secondary side to the optical component. The module can further include a primary side heatsink for the optical component, wherein the primary side heatsink is fixedly attached at one pivot point and attached to a faceplate at an opposite point via spring tabs.

In another embodiment, a printed circuit board assembly for use in a module or circuit pack in a hardware platform for networking, computing, and/or storage includes a primary side and a secondary side, wherein the primary side includes more physical space, in a vertical direction extending out from the printed circuit board assembly, than the secondary side; electrical and/or optical components disposed on the primary side; and a secondary side heatsink located on and extending from the secondary side, wherein the secondary side heatsink is disposed to one of i) an electrical and/or optical component disposed on the secondary side, and ii) an optical component disposed on the primary side, for thermal management. The primary side can include interface components for connectivity to data and/or power connections in the hardware platform. The secondary side heatsink can be a floating heatsink disposed to the electrical and/or optical component disposed on the secondary side. The secondary side heatsink can be a coin-style heatsink that extends through the printed circuit board assembly to the optical component disposed on the primary side. The optical component disposed on the primary side can be a pluggable module.

In a further embodiment, a method includes providing a module that includes a printed circuit board assembly having a primary side and a secondary side, wherein the primary side includes more physical space, in a vertical direction extending out from the printed circuit board assembly, than the secondary side, electrical and/or optical components disposed on the primary side of the printed circuit board assembly, and a secondary side heatsink located on and extending from the secondary side, wherein the secondary side heatsink is disposed to one of i) an electrical and/or optical component disposed on the secondary side, and ii) an optical component disposed on the primary side, for thermal management. The primary side can include interface components for connectivity to data and/or power connections in a hardware platform. The secondary side heatsink can be one of i) a floating heatsink disposed to the electrical and/or optical component disposed on the secondary side, and ii) a coin-style heatsink that extends through the printed circuit board assembly to the optical component disposed on the primary side.

BRIEF DESCRIPTION OF THE DRAWINGS

The present disclosure is illustrated and described herein with reference to the various drawings, in which like reference numbers are used to denote like system components/ method steps, as appropriate, and in which:

FIGS. 4A and 4B are a top view (FIG. 4A) and a section view (FIG. 4B) of an example module having components on the secondary side.

FIGS. 5A and 5B are a top view (FIG. 5A) and a section view (FIG. 5B) of an example module having components on the secondary side with a heatsink positioned on the space-restricted secondary side.

DETAILED DESCRIPTION OF THE DISCLOSURE

The present disclosure relates to systems and methods for a secondary side heatsink for optical and electrical modules. In an embodiment, the systems and methods include a floating secondary side heatsink/heat spreader. In another embodiment, the systems and methods include a height-adjustable secondary side heatsink. In a further embodiment, the systems and methods include secondary side thermal management techniques. Variously, the systems and methods contemplate use in high density modules including pluggable optical and electrical modules and especially with space restricted PCBAs.

Floating Heatsink

Figure 1A:
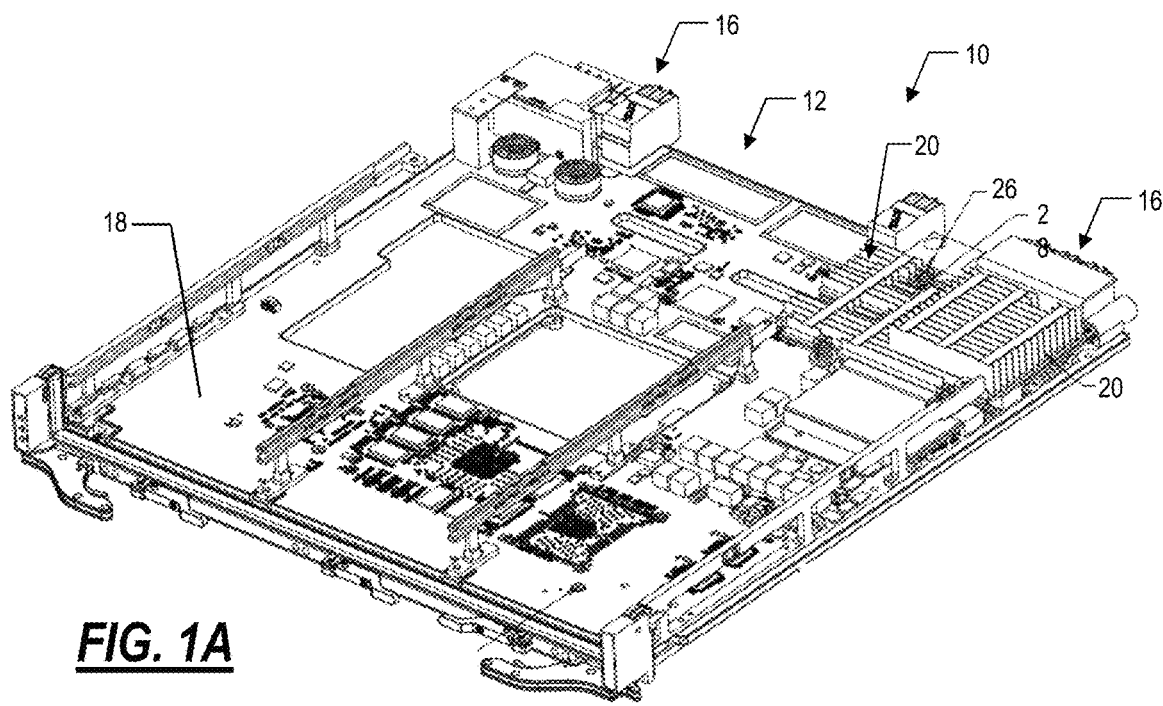
FIGS. 1A and 1B are perspective diagrams of an example module illustrating a primary side (FIG. 1A) and a secondary side (FIG. 1B).
Figure 1B:
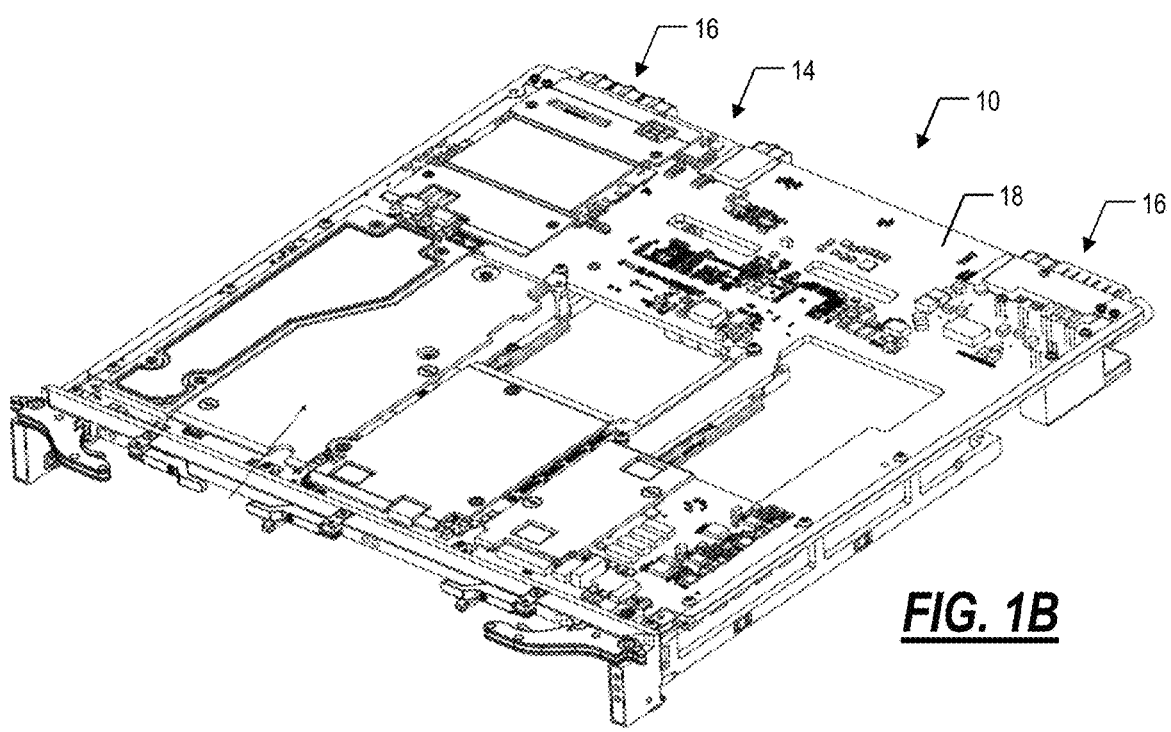
Figure 2:
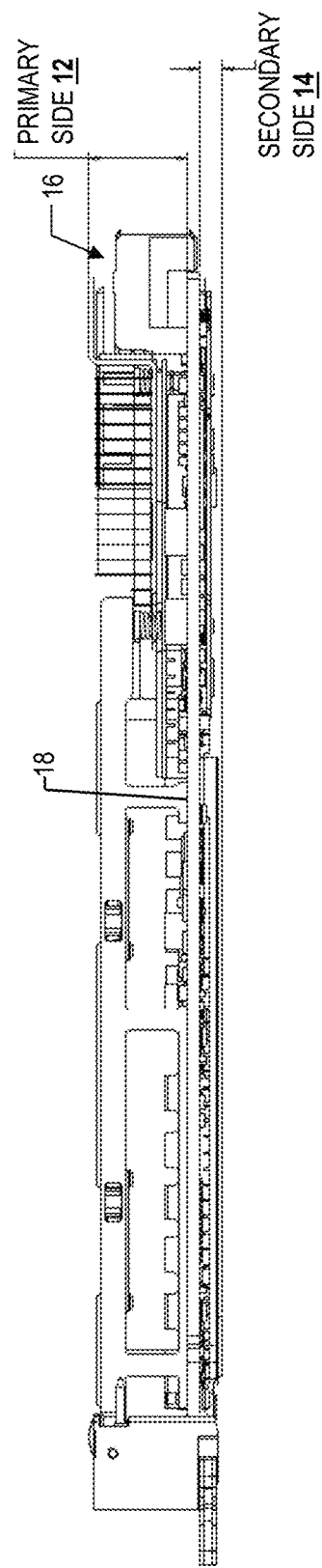
FIG. 2 is a side view diagram of the example module.
Figure 3A:
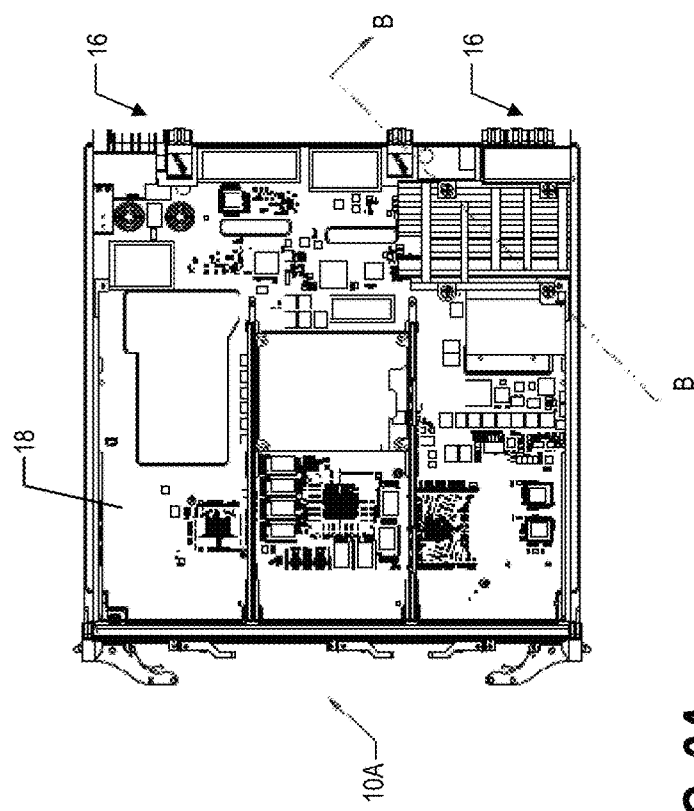
FIGS. 3A and 3B are a top view (FIG. 3A) and a section view (FIG. 3B) of a conventional module with a floating heatsink on the primary side.
Figure 3B:
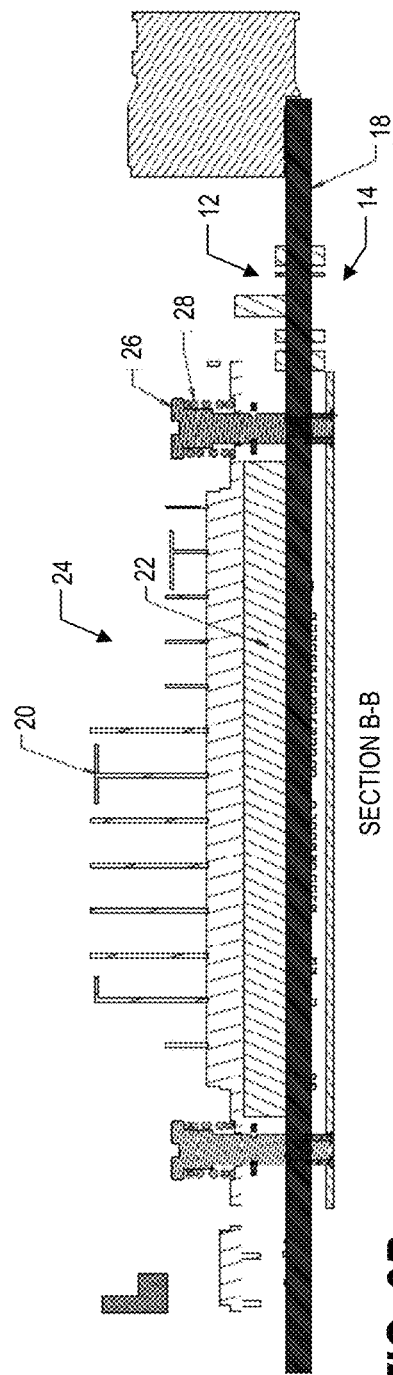

FIGS. 1A and 1B are perspective diagrams of an example module 10 illustrating a primary side 12 (FIG. 1A) and a secondary side 14 (FIG. 1B). FIG. 2 is a side view diagram of the example module 10. FIGS. 3A and 3B are a top view (FIG. 3A) and a section view (FIG. 3B) of a conventional module 10A with a floating heatsink 20 on the primary side 12. FIGS. 4A and 4B are a top view (FIG. 4A) and a section view (FIG. 4B) of an example module 10B having components on the secondary side 14. FIGS. 5A and 5B are a top view (FIG. 5A) and a section view (FIG. 5B) of an example module 10C having components on the secondary side 14 with a heatsink 20 positioned on the space-restricted secondary side 14.

Again, the modules 10, 10A, 10B, 10C are used in a hardware platform to implement some functionality. For example, the modules 10, 10A, 10B, 10C can include various optical and/or electrical components on a PCBA 18 that includes the primary side 12 and the secondary side 14. As described herein, the primary side 12 has more space, i.e., real estate than the secondary side 14. Accordingly, higher height components, including thermal management components are typically placed on the primary side 12, as in FIGS. 1A, 1B, and 2. In an embodiment, the modules 10, 10A, 10B, 10C include interface components 16 that are configured to connect to a backplane, midplane, etc. for data and/or power connections in the hardware platform. For example, the modules 10, 10A, 10B, 10C can slot into the backplane of the hardware platform, and the primary side 12 can be the one where the interface components 16 extend from. Of course, the labeling of the primary side 12 and the secondary side 14 can be arbitrary based on which side has more space.

Modules and circuit packs, such as the modules 10, 10A, 10B, 10C, are getting increasingly more powerful and the PCBA 18 design significantly more complex and densely packed. As a result, thermal powers are also increasing, and the component placement locations are limited. In some instances, some high power Ball Grid Array (BGA) components 22 (or other types of components) are being placed on the secondary side 14 of the PCBA 18. For example, prior art placement of the BGA components 22 on the primary side 12 is illustrated in FIGS. 3A and 3B, whereas placement of the BGA components 22 on the secondary side 14 is illustrated in FIGS. 4A, 4B, 5A, and 5B. The placement of the BGA components 22 on the secondary side 14 is where vertical space is limited, especially on conventional circuit packs, such as the modules 10, 10A, 10B, 10C.

Such components 22 require floating heatsinks 20 that apply a consistent, uniform spring force across the top of the component 22 in order to maintain sufficient contact across the thermal interface and dissipate heat from the component 22. However, conventional techniques of applying spring force take up too much vertical height 24 as illustrated in FIG. 3B. The vertical height 24 in FIG. 3B on the primary side 12 is not available on the secondary side 14 of the module 10, 10A, 10B PCBA 18, as illustrated in FIGS. 4B and 5B.

There is a requirement to provide the spring force to the heatsink 20. Conventionally, the spring force is provided via shoulder screws 26 and a coil spring 28 that are screwed into a thread fastener in the PCBA 18, as illustrated in FIG. 3B. Here, there is adequate space on the primary side 12. When the components 22 are on the secondary side 14, as in FIG. 4B, instead of screwing into a thread fastener in the PCBA 18, the shoulder screw 26 passes through a clearance hole in the PCBA 18 and screws into the heatsink 20 or heat spreader itself, as illustrated in FIG. 4B. This allows for the spring force to be applied to the component using the shoulder screws 26 and the coil spring 28 within the space constraints of the secondary side 14.

The approach in FIG. 4B occupies significant real estate 32 on the primary side 12 of the PCBA 18 which could ideally be accommodated by heatsinks 20, components 22, removable (pluggable) modules, etc. That is, the approach in FIG. 4B wastes the real estate 32 on the primary side 12.

This approach in FIG. 4B is difficult to implement in the module 10 as it reduces density on the primary side 12. The volume that would typically be needed for the shoulder screws 26 and coil springs 28 needs to be occupied by other components 22 and heatsinks 20, or removable modules instead. In this scenario, a more compact option is presented herein in FIG. 5B.

As illustrated in FIG. 5B, the present disclosure includes a heatsink 20 or heat spreader positioned on a PCBA 18 component 22 on the space-restricted secondary side 14 of the PCBA 18 that floats and is sprung in such a way as that sufficient normal force is consistently applied to the component 22, while doing so within the restricted space afforded on the secondary side 14 of a PCBA 18 only, without the use of overly large shoulder screws 26 and coil springs 28 on the primary side 12, as is illustrated in FIG. 3B.

The present disclosure makes use of a heatsink 20 or heat spreader with a recessed cylindrical inset mounting point 34 which houses a compact wave spring 36 and a custom shoulder nut 38 that rests on top of the wave spring 36. This is held to the circuit pack assembly with a screw 40 from the primary side 12 which connects to the shoulder nut 38 by way of a through hole 42 in the PCBA 18. This results in only a screw head 44 occupying space on the primary side 12, which can be minimized by using a low-profile screw 40 head such as a wafer head. The wave spring 36 has the advantage of applying a proportionally more spring force per amount of spring deflection than a conventional coil spring 28, thus saving significant amounts of space 46 on the primary side 12 of the PCBA 18.

Advantageously, the approach in FIG. 5B allows a heatsink 20 or heat spreader that is floating under spring force in order to dissipate the heat of a higher power component 22 on the secondary side 14 of the PCBA 18 of a circuit pack 10. As described herein, due to increased PCBA 18 complexity and component 22 density, some of these higher power devices 22 must be placed on the PCBA 18 secondary side 14, without sufficient space on the primary side 12 to use a floating approach, necessitating this disclosure.

In FIG. 5B, the spring mechanism which includes the wave spring 36, the mounting point 34, and the shoulder nut 38 to the secondary side 14, so the entire floating heatsink 20 is effectively moved to the secondary side 14 within the available volume envelope while still providing the same level of normal force and heatsink performance as a conventional approach (FIGS. 3B and 4B).

Height Adjustable Secondary Side Heatsink

Figure 6A:
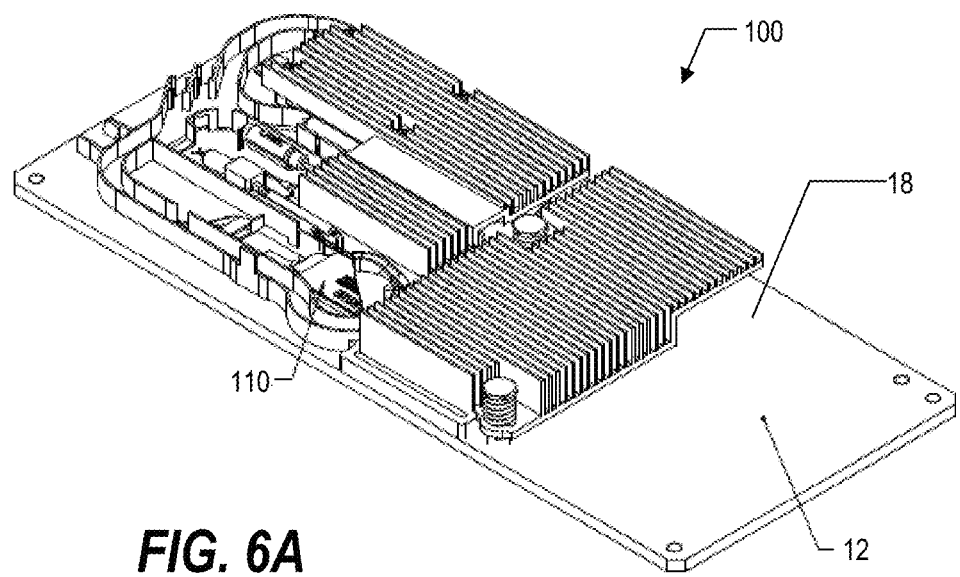
FIGS. 6A and 6B are perspective diagrams of an example module illustrating a primary side (FIG. 6A) and a secondary side (FIG. 6B) with a coin-style heatsink that protrudes from the secondary side.
Figure 6B:
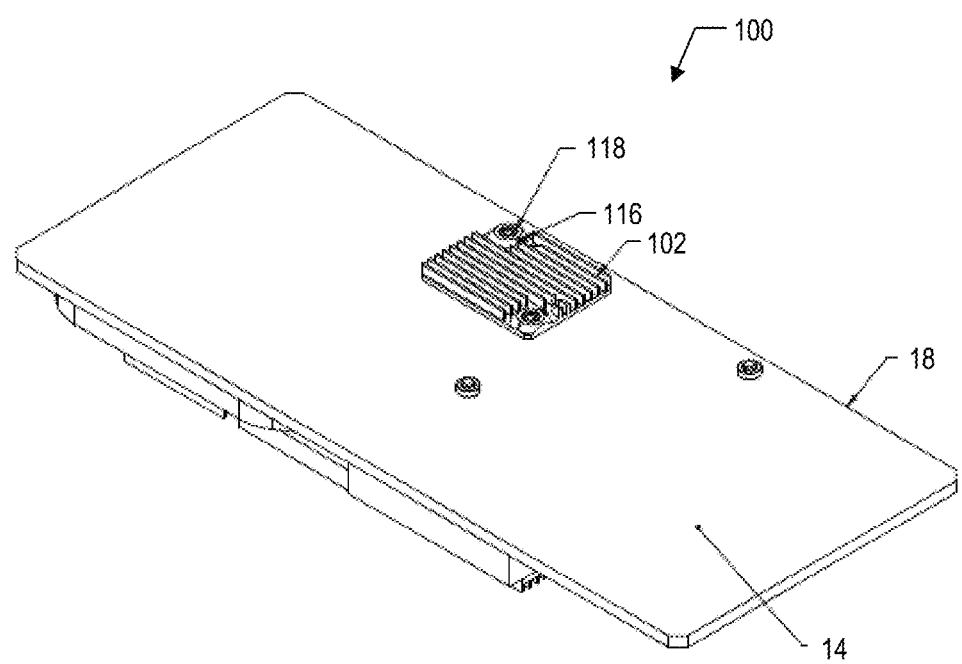
Figure 7A:
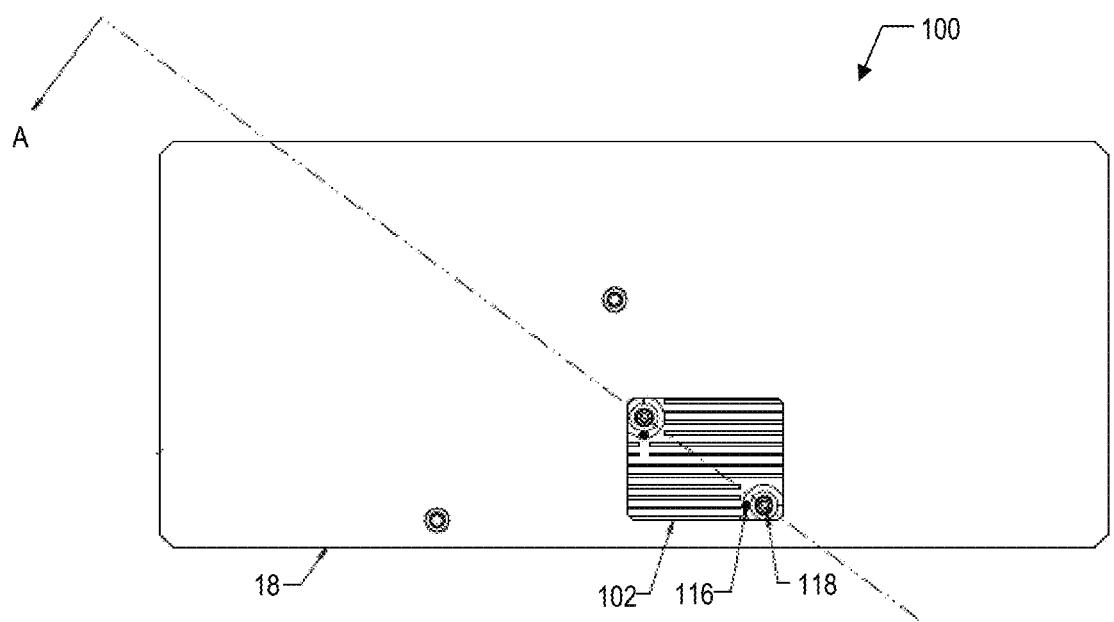
FIGS. 7A and 7B are a top view (FIG. 7A) and a section view (FIG. 7B) of the example module illustrating the coin-style heatsink that protrudes from the secondary side.
Figure 7B:
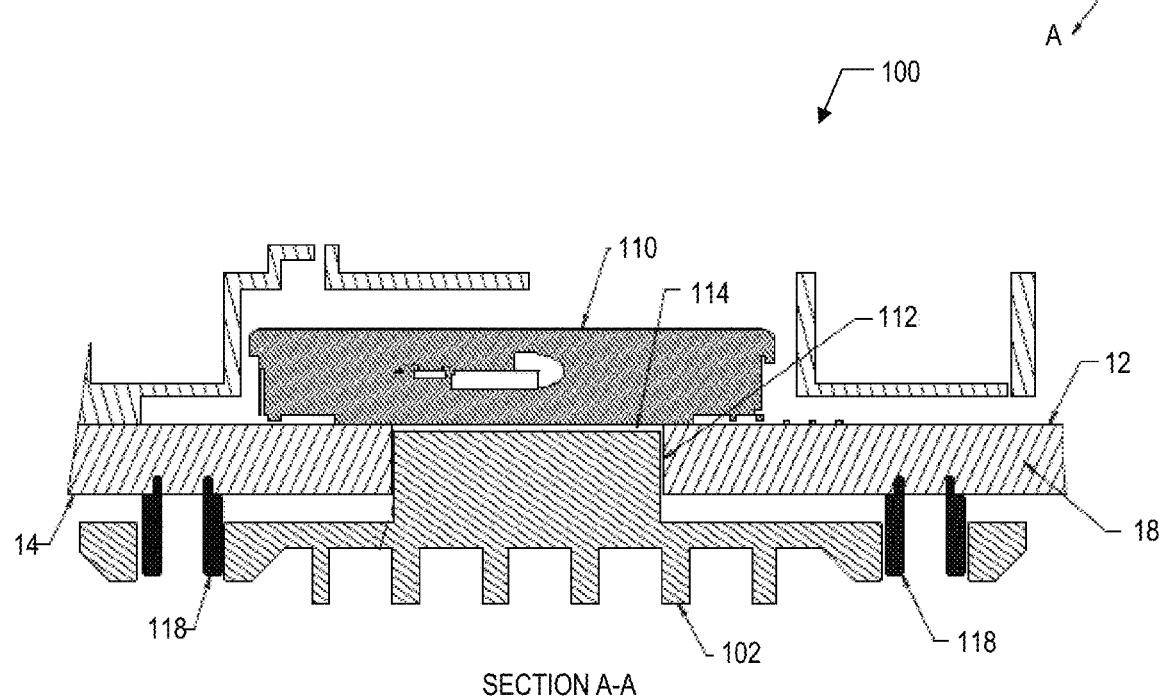
Figure 8A:
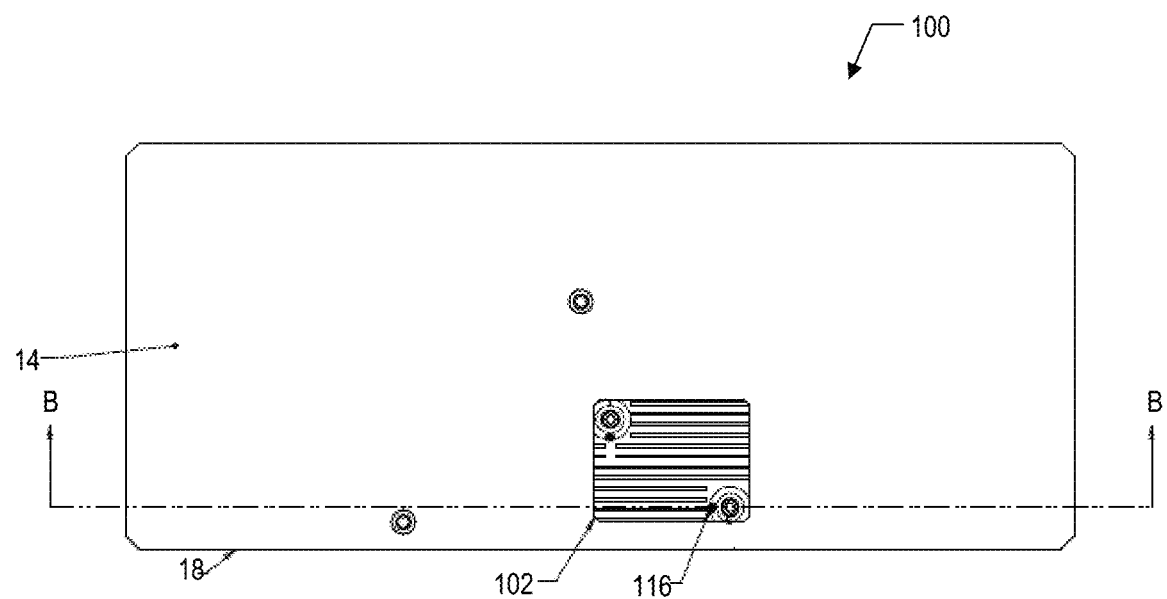
FIGS. 8A and 8B are a top view (FIG. 8A) and a section view (FIG. 8B) of the example module illustrating the coin-style heatsink from another section relative to FIG. 7B.
Figure 8B:
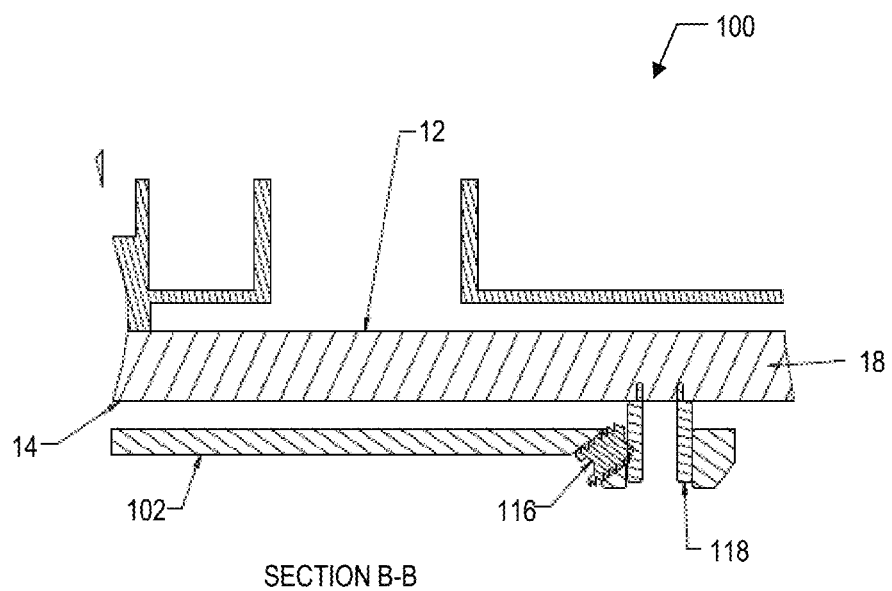
Figure 9A:
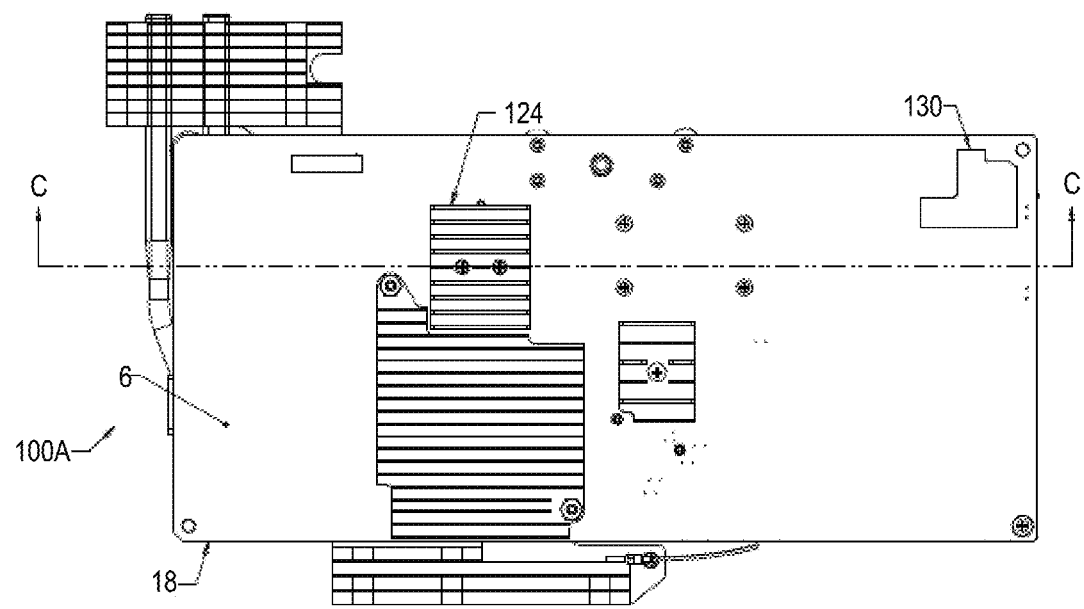
FIGS. 9A and 9B are a top view (FIG. 9A) and a section view (FIG. 9B) of a conventional module illustrating a conventional inset copper coin heatsink.
Figure 9B:
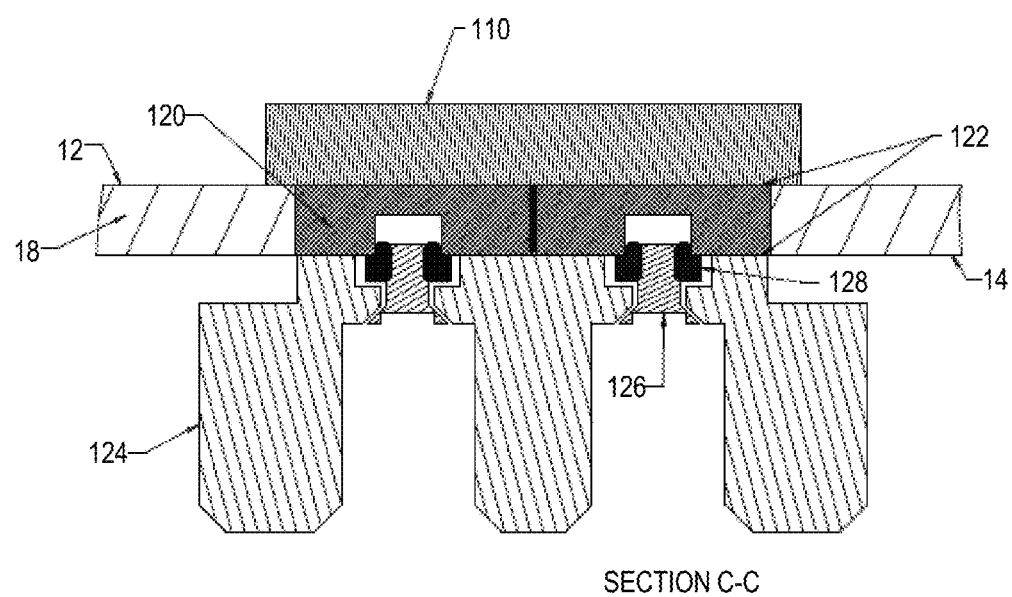
Figure 10A:
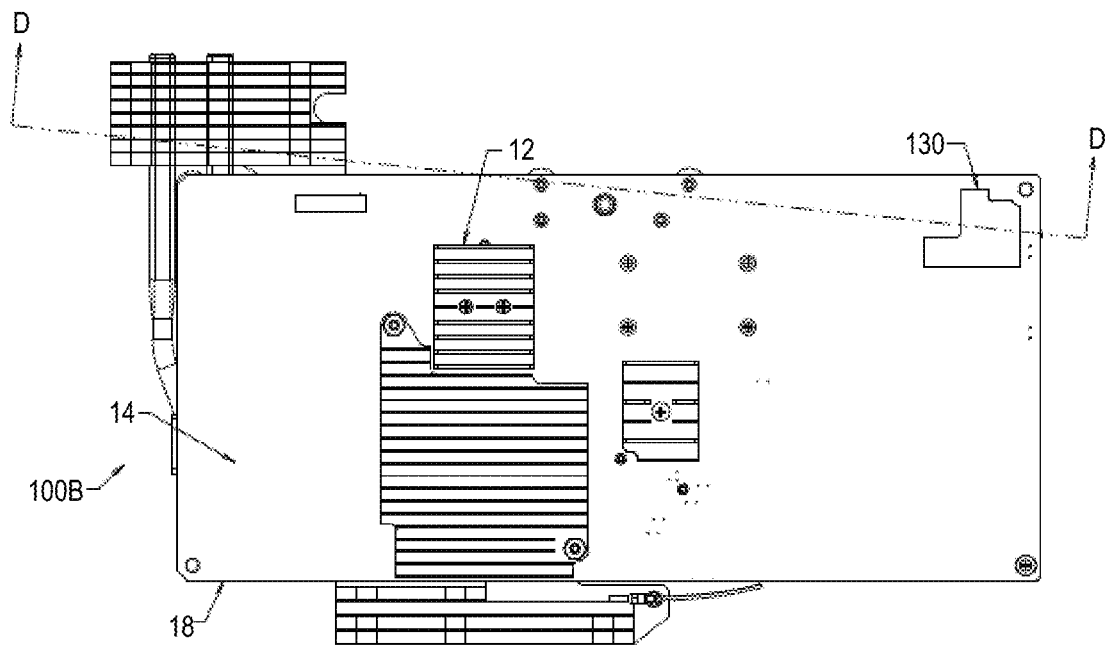
FIGS. 10A and 10B are a top view (FIG. 10A) and a section view (FIG. 10B) of a conventional module illustrating a conventional adhesive copper coin heatsink.
Figure 10B:
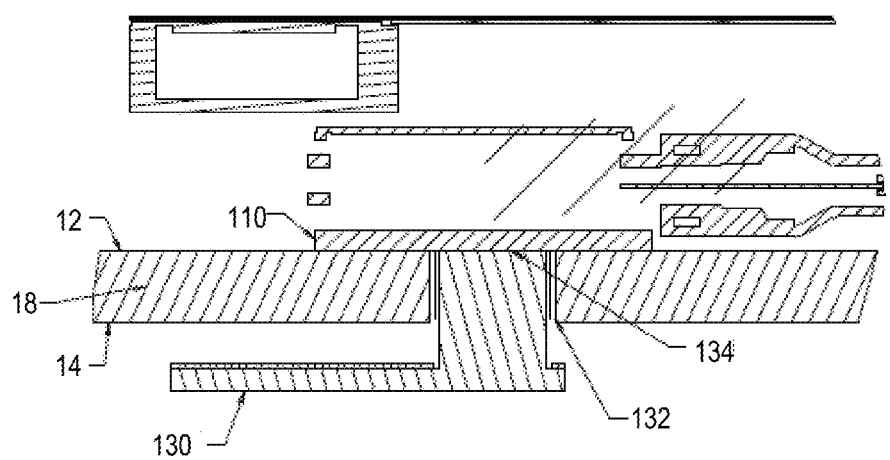

FIGS. 6A and 6B are perspective diagrams of an example module 100 illustrating a primary side 12 (FIG. 6A) and a secondary side 14 (FIG. 6B) with a coin-style heatsink 102 that protrudes from the secondary side 14. FIGS. 7A and 7B are a top view (FIG. 7A) and a section view (FIG. 7B) of the example module 100 illustrating the coin-style heatsink 102 that protrudes from the secondary side 14. FIGS. 8A and 8B are a top view (FIG. 8A) and a section view (FIG. 8B) of the example module 100 illustrating the coin-style heatsink 102 from another section relative to FIG. 7B. FIGS. 9A and 9B are a top view (FIG. 9A) and a section view (FIG. 9B) of a conventional module 100A illustrating a inset copper coin heatsink 124. FIGS. 10A and 10B are a top view (FIG. 10A) and a section view (FIG. 10B) of a conventional module 100B illustrating a conventional adhesive copper coin heatsink 106.

The modules 10, 10A, 10B, 10C may be circuit packs, line modules, etc. while the modules 100, 100A, 100B may be smaller such as pluggable modules, daughter boards, etc. Of course, the floating heatsink 20 described with respect to the modules 10, 10C may be used with the modules 100, 100A, 100B and the height-adjustable heatsink 102 in the modules 100 may be used with respect to the modules 10, 10A, 10B, 10C.

The present disclosure includes the coin-style heatsink 102 that protrudes from the secondary side 14 of a PCBA 18 to heatsink 102 an optical device 110 on the primary side 12 of the PCBA 18. The coin-style heatsink 102 protrudes through a hole 112 in the PCBA 18 to make contact with the optical device 110 through a thermal interface 114. Its contact surface located at the thermal interface 114 is height adjustable using two set screws 116 in the coin style heatsink 102 and two cylindrical posts 118 mounted to the PBCA 18 secondary side 14. The height adjustment is a necessity due to PCB thickness tolerances being +/−10%. By implementing such a heatsink 102, expensive copper coins 120 (FIG. 9B) are not required to be added to the PCBA 18 stack-up to allow for heat dissipation from this primary side 12 optical devices 110. Note, the set screws 116 do not show up in the sectional drawing of FIG. 7B, only due to the direction of the section; a different orientation of the set screws 116 may result in them showing up in this same sectional view.

The coin-style heatsink 102 is adjustable to various PCBA 18 thicknesses by using the adjustable set screws 116 that interface with the cylindrical post 118 on the secondary side 14 of the PCBA 18 to hold the contact surface of the coin-style heatsink 102 at the correct distance for thermal interface 114 spacing with the primary side 12 and the optical device 110 mounted there. By doing so, this allows the heatsink 102 to make proper thermal contact with the optical device 110, through the single thermal interface 114, regardless of manufacturing tolerance on PCBA 18 thickness, reducing PCBA 18 complexity by removing the need for embedded copper coins 120 (FIG. 9B).

Note, the adjustable set screws 116 that interface with the cylindrical posts 118 are an example of an adjustable mechanical interface for adjusting the height of the heatsink 102. Other approaches are also contemplated.

Conventionally, an inset copper coin 120 would be required in the PCBA (FIG. 9B), which is a complex and costly option. The embedded coin 120 solution requires two thermal interfaces 122 between the optical device 120 and a heatsink 124 on the secondary side 14 of the PCBA 18. The heatsink 124 is typically secured to the embedded coin 120 via screws 126 and PEMs 128. A secondary option would be to produce a similar coin-style heatsink 130, as illustrated in FIG. 10B, and adhere it to the optical device 110 through a hole 132 in the PCBA 18 with adhesive 134.

The embedded copper coin 120 in FIG. 9B is complicated, and there are many manufacturing issues that need to be considered to properly fabricate. This is costly and complex, and lower PCBA yields may also be present as a result. Additionally, two thermal interfaces 122 are required between the optical device 110 and its heatsink 124, reducing heatsink 124 performance.

The adhesive 134 coin style heatsink 130 option in FIG. 10B is simple, but has risks, as the adhesive 134 may fail over time, causing the heatsink 130 to fall off, potentially damaging the module 100B or PCBA 18. There is also potential to damage the sensitive optical device 110 during handling since the heatsinks' 130 only mechanical connection is direct to the underside of the optical device 110 via adhesive 134 instead of a stronger connection to the PCBA 18 as with the approach of FIGS. 6-8.

The present disclosure removes the need for a PCBA embedded coin 120 by allowing a coin-style heatsink's 102 contact surface at the thermal interface 114 to be height adjustable to make proper thermal contact with the base of the optical device 110 on the primary side 12 of the PCBA 18. By using set screws 116 on the heatsink 102 interfacing with two posts 118 on the secondary side 14 of the PCBA 18, the coin-style heatsink's 102 positions can be accurately set without the need for problematic adhesives 134. Additionally, thermal interface materials with better thermal conductivity can be used, increasing the heatsink 102 performance.

Secondary Side Thermal Management Techniques

Figure 11A:
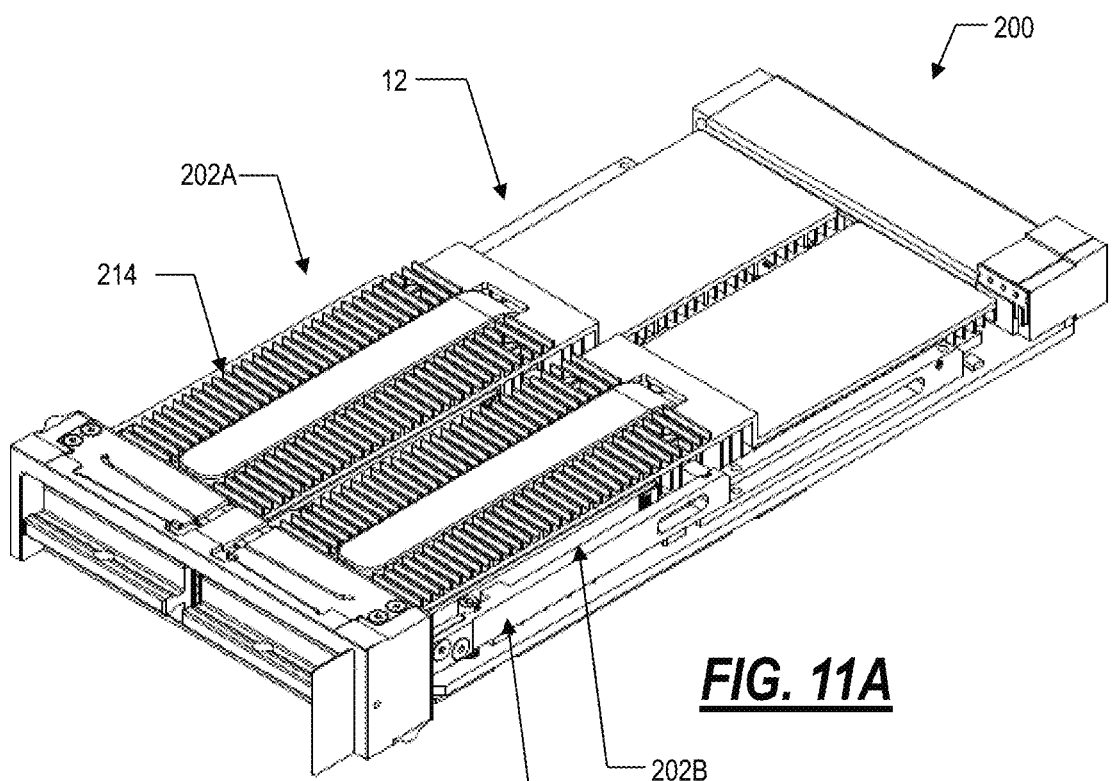
FIGS. 11A-11E are diagrams of example module supporting two example pluggable modules and illustrating a perspective of a primary side of the module (FIG. 11A), a perspective of a secondary side of the module (FIG. 11B), a top view of the secondary side of the module (FIG. 1C), a front view of the module (FIG. 11D), and a side view of the module (FIG. 11E).
Figure 11B:
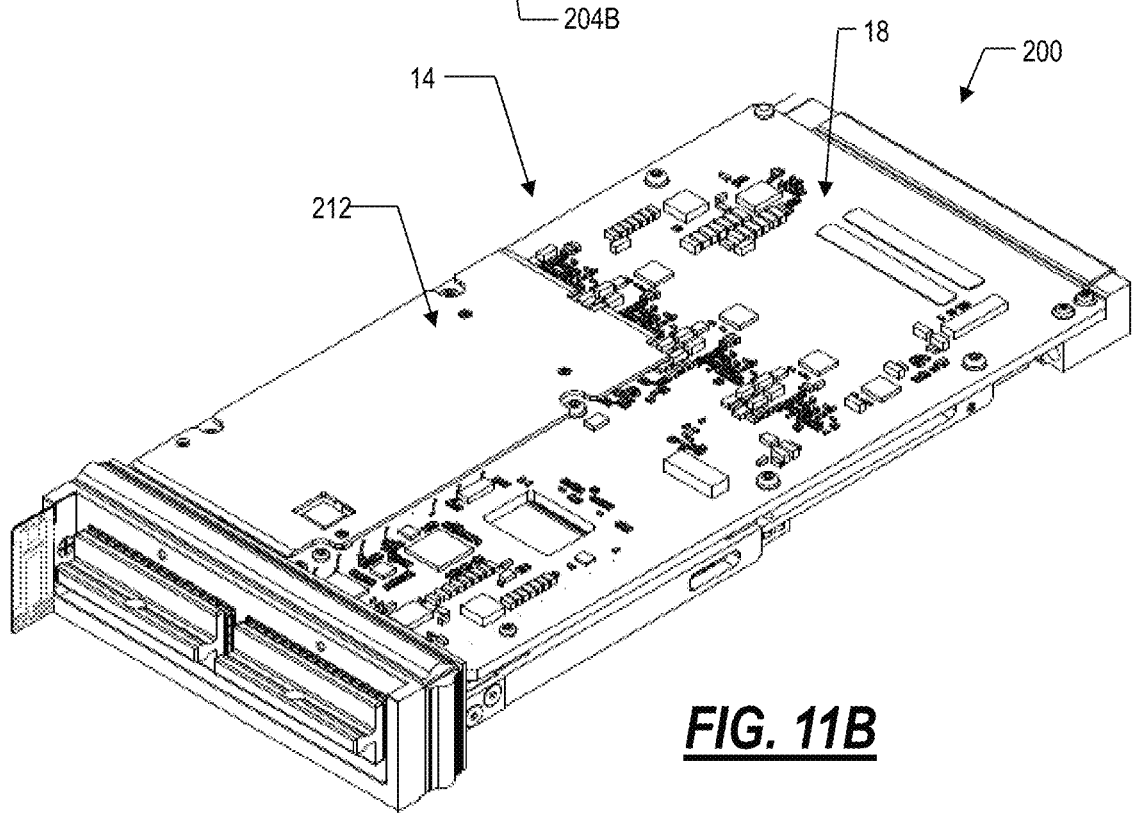
Figure 11C:
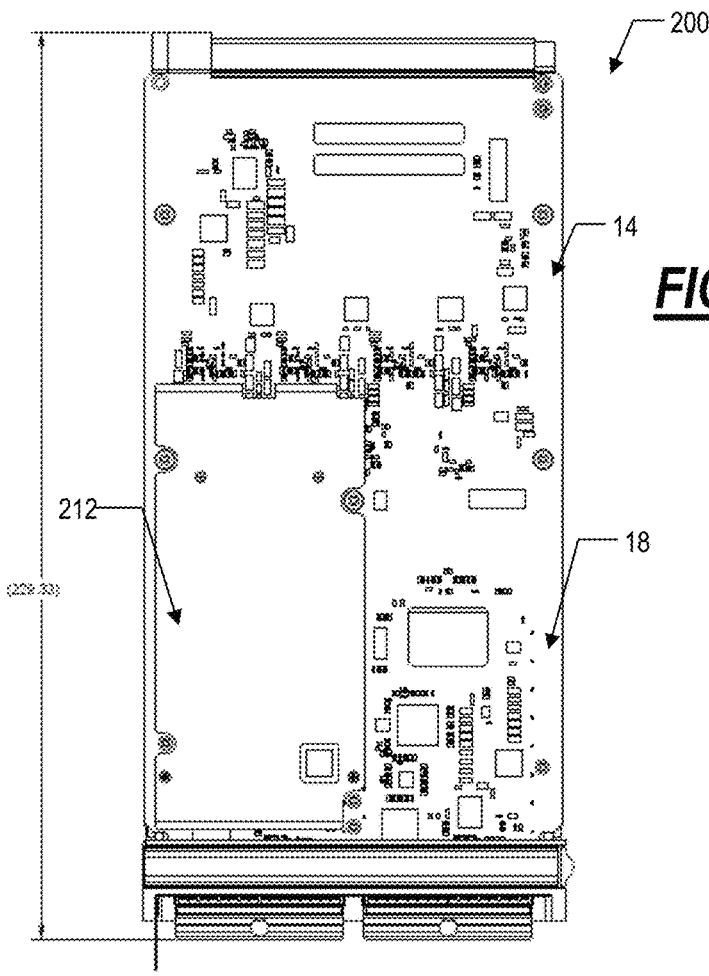
Figure 11D:
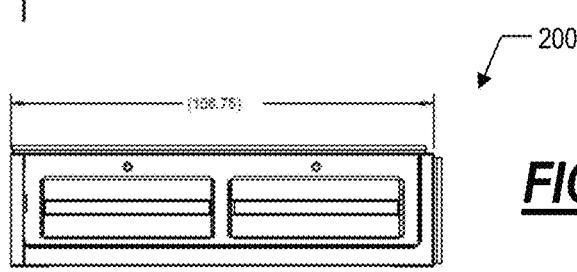
Figure 11E:
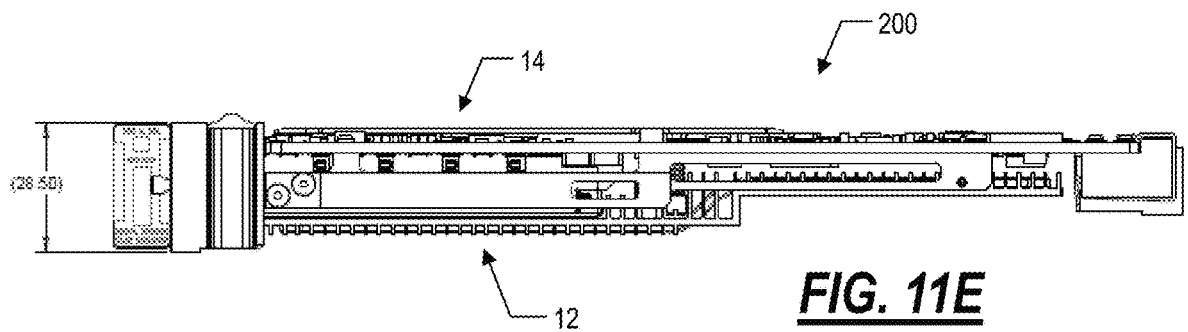

FIGS. 11A-11E are diagrams of example module 200 supporting two example pluggable modules 202A, 202B and illustrating a perspective of a primary side 12 of the module 200 (FIG. 11A), a perspective of a secondary side 14 of the module 200 (FIG. 11B), a top view of the secondary side 14 of the module 200 (FIG. 11C), a front view of the module 200 (FIG. 11D), and a side view of the module 200 (FIG. 11E). FIGS. 12A-12D are diagrams of the example module 200 illustrating steps in a process for heatsink mounting, heatsink alignment, heatsink pivoting and springing, in corresponding cages 204A, 204B for the pluggable modules 202A, 202B.

In an embodiment and in the description herein, the pluggable module 202 is a CFP2-DCO module (C Small Form Factor Pluggable Digital Coherent Optics). Of course, other types of pluggable optical modules are also contemplated, such as, for example, CFP, CFP2, CFP4, QSFP, QSFP2, QSFP-DD, etc. For example, CFP2-DCO is described in OIF IA #OIF-CFP2-DCO-01.0 "Implementation Agreement for CFP2-Digital Coherent Optics Module," Oct. 17, 2018, the contents of which are incorporated herein by reference.

Conventional approaches to providing adequate thermal relief for CFP2 modules 202 is to provide large heatsinks, located on the primary side 12 of the module 200. Other approaches may include changing the airflow direction from side to side airflow over the module 202 to front to back airflow of the module 202. This can help provide cooler air over the module 202. Disadvantageously, these solutions require the availability of large physical areas around and behind the pluggable module cage 204 to provide large heatsinks which in most designs is not available due to the product density needed, e.g., on the module 200, in the hardware platform, etc. As for changing from side to side airflow to front to back airflow is not possible on existing and established products and are not always accepted in some markets segments or go against current customer practices. That is, airflow is fixed in a hardware platform, and many customers require a certain direction airflow based on their deployment practices.

The present disclosure provides techniques to address the thermal management of a higher power module (e.g., the CFP2-DCO) where primary side 12 and secondary side 14 heatsink fin height must be quite limited. Technology consolidation is now allowing higher-powered coherent optical modules to fit into Multi-Source Agreement (MSA) standard form-factor pluggable optics module. In addition, transmission platforms continue to increase power densities with every generation of products. Typically, the temperature of a pluggable module 202 must be kept to 70 deg. C. or below otherwise it will not function correctly. However, the above density increases are pushing the thermal profile of these optical modules 202 much higher than what the MSA originally intended to support. These changes make thermal management of the higher power optical modules 202 an increasing challenge and is driving the need for enhanced heatsinking techniques.

In an embodiment, the needed enhanced thermal management is achieved by modifying an MSA standard CFP2 cage 204 to allow for the addition of direct pluggable module heatsinking from the secondary side 14 of the module 200 and through to the secondary side 14 of the PCBA 18. The present disclosure provides a broad array of thermal management techniques which make use of the available space on space constricted areas and/or the secondary side 14 of a pluggable module 202, and/or the secondary side 14 of the PCBA 18 itself. The various thermal management techniques described herein make novel use of available, but limited space within an assembly, to fully optimize thermal management by leveraging all possible available space to do so. As mentioned, component and piece part density on the primary side 12 of assemblies (the PCBA 18) and/or pluggable modules 202 are in some cases becoming extremely space limited, making thermal management a significant challenge, which is driving innovation of enhanced heatsinking techniques. The present disclosure includes techniques for heatsink mounting, heatsink alignment, heatsink pivoting and springing to ensures the pluggable module 202 has the necessary surface contact to both the primary side 12 and secondary side 14 heatsinks while inserted. It also ensures the forces needed to insert and remove the pluggable module 202 are within acceptable limits.

The present disclosure includes cutting a hole 210 through the MSA standard CFP2 cage 204 and PCB 18 to access the pluggable module 202 from the secondary side 14 of the PCBA 18 (FIGS. 11B, 11C, 12A), for a secondary side heatsink 212. Alternately, the coin heatsink 102 in the PCBA 18 could be used to bring the heat out to the secondary side heatsink 212 while minimizing thermal resistance. The hole 210 allows access to the pluggable module 202 from the secondary side 14 of the PCBA 18 or PCB coin. This hole 210 allows the use of additional heatsinking from the secondary side 14 of the PCBA 18. Normally no heatsinking at all is possible from the secondary side 14 when using MSA standard cages. This will allow further cooling of the pluggable module 202 to aid in keeping it within its operational temperature limits Also, the present disclosure includes mounting a spring-loaded secondary heatsink 212 to ensure appropriate insertion forces during the pluggable module 202 insertion and to provide good contact at full insertion.

The present disclosure further includes mounting a primary side heatsink 214 using external force and pivot point to ensure appropriate insertion forces during the pluggable module 202 insertion and to provide good contact at full insertion. The goal is to apply a uniform and controlled force against the module 202. The conventional approach is to use the available clip-system provided by the cage manufacturer. The present disclosure makes use of force points external to the cage 204 in a manner which ensures the load is uniform and controlled between CFP2-DCO module 202 and the adjacent heat sinks. This could include four spring points positioned approximately adjacent to each of the four corners of the module 202. Also, this could include two spring points 216 (per heat sink) adjacent to the rear corners, and one sprung line-contact 218 at the faceplate (this can also be called a spring line or spring gasket). This particular feature at the faceplate minimizes the footprint on the PCBA 18. Of note, this external force and pivot point can be used with or without the hole 210 for the secondary side heatsink 212.

On MSA standard CFP2 cages 204, the heatsink mounts in such a way that the pluggable module 202 will slide into the cage 204 and slide up against the primary side only heatsink during insertion and have good contact between the module 202 and the heatsink once fully inserted. The MSA required insertion force, and the contact specifications must be respected.

With the addition of the secondary side heatsink 212, the module, rather than sliding between cage bottom and primary side heatsink 214, will now slide up against both the primary and secondary side heatsinks 214, 212. To not exceed the MSA standard insertion force requirements while now having more heatsink surface and potential pressure increase on the module 202, a pivot point mounting approach is used. The pivot point is towards the center of the primary side heatsink 214 and allows for easy insertion (normal insertion force) at the beginning of the insertion and enough and appropriate contact to both the primary and secondary side heatsinks 214, 212 once the module 202 is fully inserted. That is, the present disclosure supports heatsinks 212, 214 on both sides of the pluggable module 202 while conforming to MSA standards.

Figure 12A:
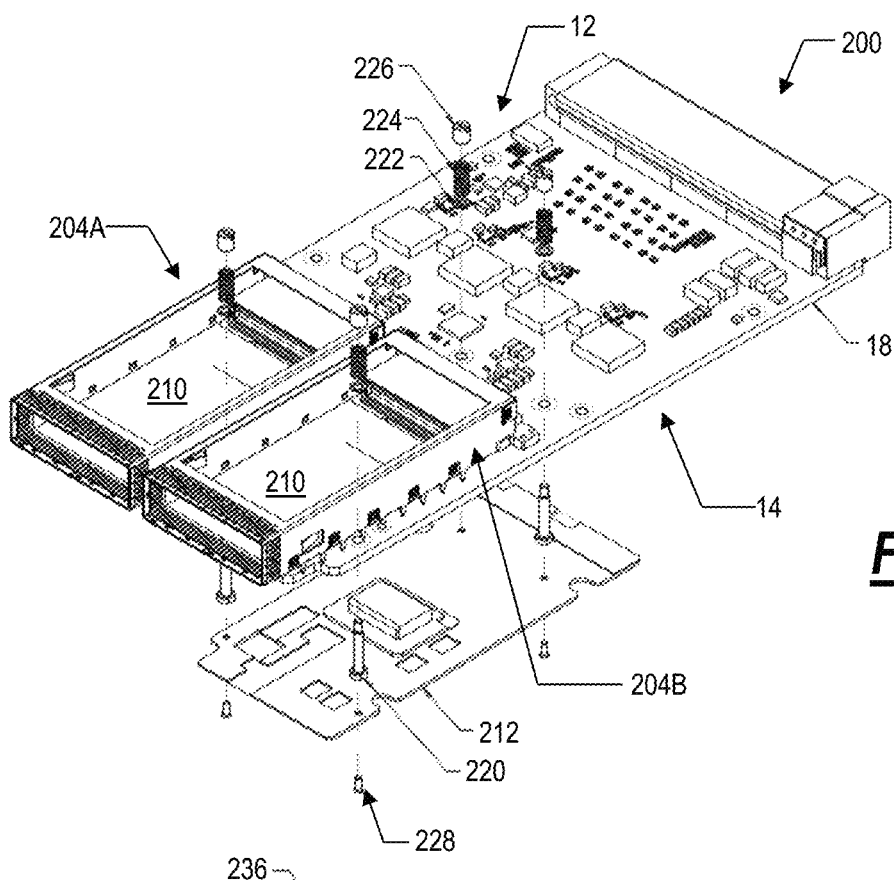
FIGS. 12A-12D are diagrams of the example module illustrating steps in a process for heatsink mounting, heatsink alignment, heatsink pivoting and springing, in corresponding cages for the pluggable modules.
Figure 12B:
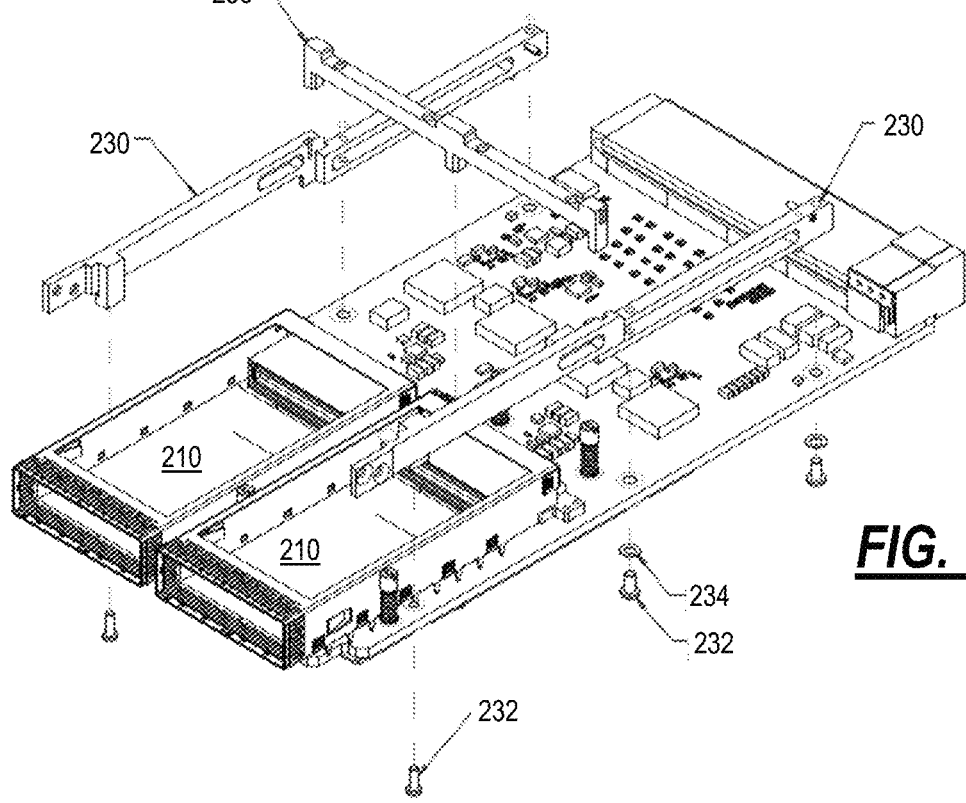
Figure 12C:
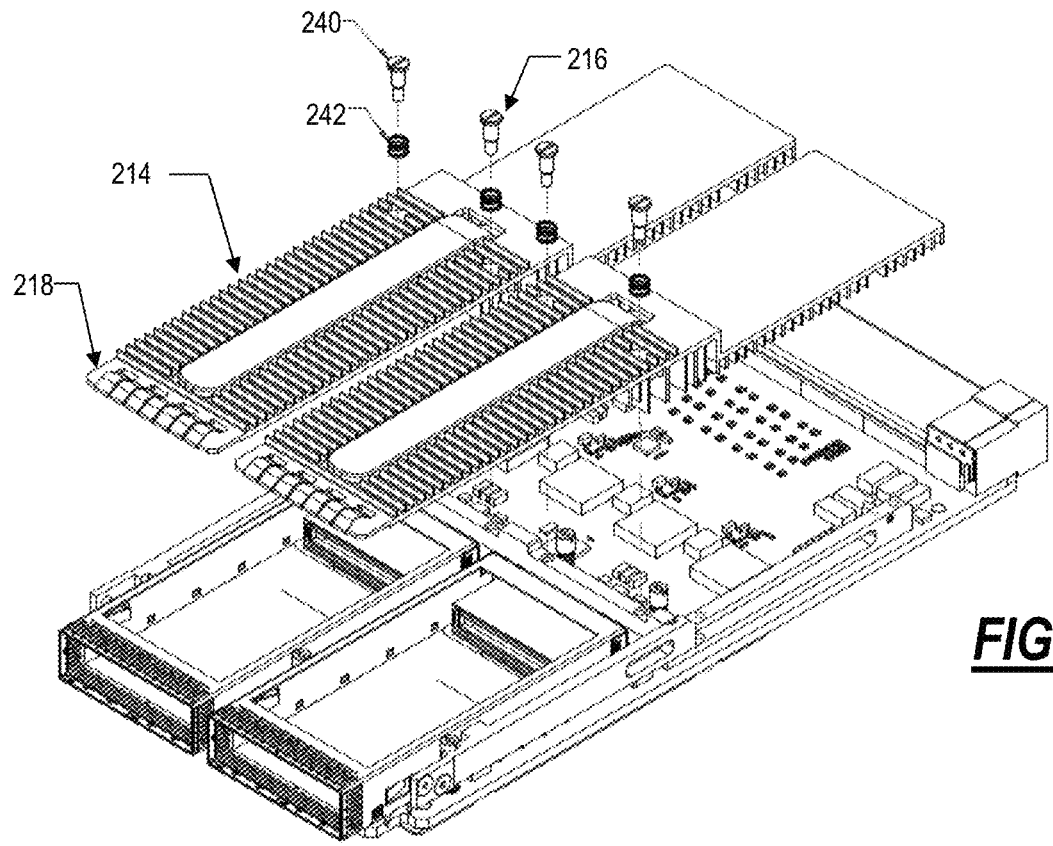
Figure 12D:
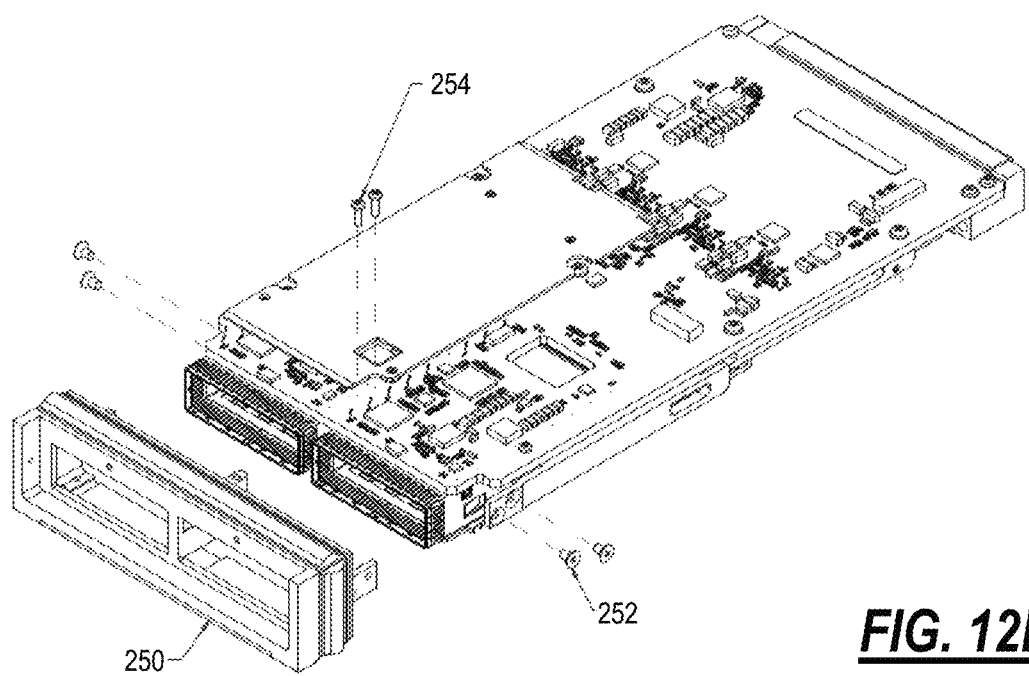

FIGS. 12A-12D illustrate the steps in a process for heatsink mounting, heatsink alignment, heatsink pivoting, and springing. In FIG. 12A, the holes 210 are included in the cages 204 and through the PCBA 18. Standoffs 220 are installed through mounting holes from the secondary side 14 of the module 202. Washers 222 are placed over the standoffs 220 from the primary side 12, along with springs 224 and nuts 226. The heatsink 212 is placed over the hole 210 and screwed in place with screws 228 that attach to the standoffs 220. In FIG. 12B, faceplate support rails 230 are installed utilizing screws 232 and washers 234. A support rail 236 is installed by aligning tabs with grooves on the rails 230. In FIG. 12C, the primary heatsinks 214 are screwed in place with screws 240 and springs 242. In FIG. 12D, a faceplate 250 is installed utilizing screws 252, 254.

Module

In an embodiment, a module 10, 100, 200, 202 for use in a hardware platform for networking, computing, and/or storage includes a printed circuit board assembly 18 having a primary side 12 and a secondary side 14, wherein the primary side 12 includes more physical space, in a vertical direction, extending out from the printed circuit board assembly 18, than the secondary side 14; electrical and/or optical components 22, 110 disposed on the primary side 12 of the printed circuit board assembly 18; and a secondary side heatsink 30, 102, 212 located on and extending from the secondary side 14, wherein the secondary side heatsink 30, 102, 212 is disposed to one of i) an electrical and/or optical component 22 disposed on the secondary side 14, and ii) an optical component 110 disposed on the primary side 12, for thermal management.

The primary side 12 includes interface components 16 for connection to data and/or power connections in the hardware platform. The secondary side heatsink 30, 102, 212 can be a floating heatsink 30 disposed to the electrical and/or optical component 22 disposed on the secondary side 14. The electrical and/or optical component 22 disposed on the secondary side 14 is a Ball Grid Array (BGA) component. The floating heatsink 30 is connected through the printed circuit board assembly to the primary side via a compact wave spring 36.

The secondary side heatsink 30, 102, 212 can be a coin-style heatsink 102 that extends through the printed circuit board assembly 18 to the optical component 110 disposed on the primary side 12. The coin-style heatsink 102 has an adjustable height on the secondary side 14. The module of claim 6, wherein the coin-style heatsink 102 has an adjustable height on the secondary side via set screws 116 and cylindrical posts 118.

The optical component disposed on the primary side can be a pluggable module 202. The module can further include a cage 204 disposed on the primary side 12, for the optical component, wherein a hole 210 is located in the printed circuit board assembly 18 where the secondary side heatsink 212 is able to contact the pluggable module 202. The secondary side heatsink 212 is a coin-style heatsink that protrudes from the secondary side to the optical component. The module can further include a primary side heatsink 214 for the optical component, wherein the primary side heatsink is fixedly attached at one pivot point and attached to a faceplate at an opposite point via spring tabs.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims.

What is claimed is:

1. A system for use in a hardware platform for networking, computing, and/or storage, the system comprising:
   a printed circuit board assembly having a primary side and a secondary side, wherein the primary side includes more physical space, in a vertical direction extending out from the printed circuit board assembly, than the secondary side;
   one or more optical components disposed on a surface of the printed circuit board assembly on the primary side of the printed circuit board assembly, wherein the optical components include a pluggable optical module which is removable from the printed circuit board assembly; and
   a secondary side heatsink located on and extending from the secondary side, wherein the secondary side heatsink is in thermal communication with and disposed via a direct thermal interface opposite of the pluggable optical module disposed on the primary side, for thermal management, when the pluggable module is inserted.

2. The system of claim 1, wherein the secondary side heatsink is floating under a spring force including attachment components disposed on the primary side.

3. The system of claim 2, wherein the attachment components are located through holes in the printed circuit board assembly.

4. The system of claim 1, wherein the secondary side heatsink includes an adjustable vertical height relative to the optical component via an adjustable mechanical interface.

5. The system of claim 4, wherein the adjustable mechanical interface is a set screw and cylindrical post.

6. The system of claim 4, wherein the adjustable vertical height is set via the adjustable mechanical interface and is based on a thickness of the printed circuit board assembly.

7. The system of claim 1, wherein the secondary side heatsink protrudes through a hole in the printed circuit board assembly to attach to the some of the optical components.

8. The system of claim 1, wherein the printed circuit board assembly and the components are in a pluggable optical module compliant to a multi-source agreement.

9. The system of claim 8, further comprising a cage for housing the pluggable optical module, wherein the secondary side heatsink protrudes through a hole in the cage.

10. The system of claim 1, wherein the printed circuit board assembly, the components, and the secondary side heatsink are in a pluggable optical module compliant to a multi-source agreement.

11. A method comprising:
providing a system for use in a hardware platform for networking, computing, and/or storage, the system comprising:
a printed circuit board assembly having a primary side and a secondary side, wherein the primary side includes more physical space, in a vertical direction extending out from the printed circuit board assembly, than the secondary side;
one or more optical components disposed on a surface of the printed circuit board assembly on the primary side of the printed circuit board assembly, wherein the optical components include a pluggable optical module which is removable from the printed circuit board assembly; and
a secondary side heatsink located on and extending from the secondary side, wherein the secondary side heatsink is in thermal communication with and disposed via a direct thermal interface opposite of the pluggable optical module disposed on the primary side, for thermal management, when the pluggable module is inserted.

12. The method of claim 11, wherein the secondary side heatsink is floating under a spring force including attachment components disposed on the primary side.

13. The method of claim 12, wherein the attachment components are located through holes in the printed circuit board assembly.

14. The method of claim 11, wherein the secondary side heatsink includes an adjustable height.

15. The method of claim 14, wherein the adjustable height is based on a set screw.

16. The method of claim 14, wherein the adjustable height is based on a thickness of the printed circuit board assembly.

17. The method of claim 11, wherein the secondary side heatsink protrudes through a hole in the printed circuit board assembly to attach to the some of the optical components.

18. The method of claim 11, wherein the printed circuit board assembly and the components are in a pluggable optical module compliant to a multi-source agreement.

19. The method of claim 18, further comprising a cage for housing the pluggable optical module, wherein the secondary side heatsink protrudes through a hole in the cage.

20. The method of claim 11, wherein the printed circuit board assembly, the components, and the secondary side heatsink are in a pluggable optical module compliant to a multi-source agreement.

* * * * *